US012622008B2

(12) United States Patent
 Razeghi

(10) Patent No.: US 12,622,008 B2
(45) Date of Patent: May 5, 2026

(54) III-NITRIDE/GALLIUM OXIDE BASED HIGH ELECTRON MOBILITY TRANSISTORS

(71) Applicant: Northwestern University, Evanston, IL (US)

(72) Inventor: Manijeh Razeghi, Wilmette, IL (US)

(73) Assignee: Northwestern University, Evanston, IL (US)

( * ) Notice: Subject to any disclaimer, the term of this patent is extended or adjusted under 35 U.S.C. 154(b) by 768 days.

(21) Appl. No.: 17/939,048

(22) Filed: Sep. 7, 2022

(65) Prior Publication Data

US 2023/0089714 A1     Mar. 23, 2023

Related U.S. Application Data

(60) Provisional application No. 63/290,265, filed on Dec. 16, 2021, provisional application No. 63/243,802, filed on Sep. 14, 2021.

(51) Int. Cl.
| | |
|---|---|
| *H10D 30/01* | (2025.01) |
| *H01L 21/02* | (2006.01) |
| *H10D 30/47* | (2025.01) |
| *H10D 62/80* | (2025.01) |
| *H10D 62/85* | (2025.01) |
| *H10D 62/852* | (2025.01) |
| *H10P 14/20* | (2026.01) |

(52) U.S. Cl.
CPC ......... *H10D 30/015* (2025.01); *H10D 30/475* (2025.01); *H10D 62/8503* (2025.01); *H10D 62/875* (2025.01); *H10D 62/852* (2025.01); *H10P 14/3216* (2026.01); *H10P 14/3416* (2026.01)

(58) Field of Classification Search
None
See application file for complete search history.

(56) References Cited

U.S. PATENT DOCUMENTS

| | | | |
|---|---|---|---|
| 3,600,240 A | 8/1971 | Rupprecht et al. | |
| 3,676,228 A | 7/1972 | Sakurai et al. | |
| 4,035,205 A | 7/1977 | Lebailly et al. | |
| 4,583,110 A | 4/1986 | Jackson et al. | |
| 4,692,194 A | 9/1987 | Nishizawa | |
| 4,939,102 A | 7/1990 | Hamm et al. | |
| 5,268,582 A | 12/1993 | Kopf et al. | |
| 2006/0027814 A1 | 2/2006 | Watanabe et al. | |
| 2006/0157733 A1* | 7/2006 | Lucovsky | H10D 64/691 |
| | | | 257/E29.151 |

(Continued)

FOREIGN PATENT DOCUMENTS

| | | |
|---|---|---|
| EP | 0090521 A2 | 3/1982 |

OTHER PUBLICATIONS

Appl. Phys. Lett. 111, 162105 (2017) (Year: 2017).*

(Continued)

*Primary Examiner* — Julio J Maldonado
*Assistant Examiner* — Pinaki Das
(74) *Attorney, Agent, or Firm* — Bell & Manning, LLC

(57) ABSTRACT

High electron mobility transistors are provided which comprise a III-Nitride semiconductor layer comprising a III-Nitride semiconductor, in contact with a gallium oxide semiconductor layer comprising gallium oxide, forming an interface therebetween.

18 Claims, 10 Drawing Sheets

(56) References Cited

U.S. PATENT DOCUMENTS

| | | | | |
|---|---|---|---|---|
| 2008/0038906 A1* | 2/2008 | Ichinose | .............. | C30B 23/02 |
| | | | | 257/E21.462 |
| 2008/0092954 A1 | 4/2008 | Choi | | |
| 2009/0231909 A1 | 9/2009 | Dieny et al. | | |
| 2010/0065855 A1* | 3/2010 | Yokoyama | ......... | H01L 21/0242 |
| | | | | 257/E33.025 |
| 2011/0186856 A1 | 8/2011 | Huang et al. | | |
| 2012/0267234 A1 | 10/2012 | Reece | | |
| 2014/0183598 A1* | 7/2014 | Chiu | .............. | H01L 21/31111 |
| | | | | 257/190 |
| 2014/0210835 A1 | 7/2014 | Hong | | |
| 2014/0346525 A1* | 11/2014 | Minoura | .............. | H10D 30/01 |
| | | | | 438/197 |
| 2014/0374765 A1* | 12/2014 | Curatola | ........... | H10D 30/4732 |
| | | | | 438/172 |
| 2017/0077330 A1 | 3/2017 | Li et al. | | |
| 2018/0197915 A1 | 7/2018 | Briggs et al. | | |
| 2018/0254355 A1 | 9/2018 | Sasaki | | |
| 2018/0287001 A1 | 10/2018 | Bedell et al. | | |
| 2018/0308996 A1 | 10/2018 | Park | | |
| 2019/0006472 A1* | 1/2019 | Matsuda | .............. | H10D 30/67 |
| 2019/0115434 A1 | 4/2019 | Sakumoto | | |
| 2020/0312660 A1 | 10/2020 | Razeghi | | |
| 2020/0350166 A1 | 11/2020 | Hosseini Teherani | | |
| 2021/0074837 A1* | 3/2021 | Hao | ................... | H10D 30/4755 |
| 2023/0411314 A1* | 12/2023 | Saunier | .................. | H01L 23/66 |
| 2024/0096618 A1 | 3/2024 | Razeghi | | |

OTHER PUBLICATIONS

Manijeh Razeghi et al., "A review of the growth, doping, and applications of β-Ga₂O₃ thin films," Proc. of SPIE vol. 10533, pp. 105330R-1-105330R-24.

Michael A. Mastro et al., "Opportunities and Future Directions for Ga₂O₃," *ECS Journal of Solid-State Science and Technology*, vol. 6, No. 5, 2017, pp. P356-P359.

Kalpana Singh et al., "Amphoteric oxide semiconductors for energy conversion devices: a tutorial review," *Chem. Soc. Rev.*, vol. 42, 2013, pp. 1961-1972.

Gang Niu, "Epitaxial systems and combining oxides and semiconductors," *Molecular Beam Epitaxy*, 2013, https://www.sciencedirect.com/topics/chemistry/metal-organic-chemical-vapor-deposition, p. 1.

Ryan McClintock et al., "Solar-blind photodetectors based on Ga2O3 and III-nitrides," Proc. SPIE vol. 11288 1128803-1, *Quantum Sensing and Nano Electronics and Photonics XVII*, 1128803 (Jan. 31, 2020); doi: 10.1117/12.2549606; pp. 1-12.

R. McClintock et al., "High quantum efficiency AlGaN solar-blind p-i-n photodiodes," *Appl. Phys. Lett*, vol. 84, No. 8, Feb. 23, 2004; pp. 1248-1250; https://doi.org/10.1063/1.1650550.

S. Keller et al., "Indium-surfactant-assisted growth of high-mobility AlN/GaN multilayer structures by metalorganic chemical vapor deposition," *Appl. Phys. Lett.* Nov. 19, 2001, vol. 79; No. 21, pp. 3449-3451. https://doi.org/10.1063/1.1420573.

Manijeh Razeghi et al., "review of III-nitride optoelectronic materials for light emission and detection," *Phys. Stat. Sol.* © 1, No. S2, S141-S148 (2004) DOI 10.1002/pssc.200405133.

Takashi Aisaka et al., "Improvement of surface morphology of nitrogen-polar GaN by introducing indium surfactant during MOVPE growth," *Japanese Journal of Applied Physics* 53, 085501 (2014); pp. 1-5. http://dx.doi.org/10.7567/JJAP.53.085501.

Erin C. H. Kyle et al., "Increased p-type conductivity through use of an indium surfactant in the growth of Mg-doped GaN," *Appl. Phys. Lett.* 106, 222103 (2015); https://doi.org/10.1063/1.4922216.

Yingda Chen et al., "High hole concentration in p-type AlGaN by indium-surfactant-assisted Mg-delta doping," *Appl. Phys. Lett.* 106, 162102 (2015); https://doi.org/10.1063/1.4919005.

Junhee Lee et al., "High Thermal Stability of K—Ga2O3 Grown by MOCVD," *Crystals* 2021, 11, 446; pp. 1-5. https://doi.org/10.3390/cryst11040446.

Junhee Lee et al., "Highly Conductive Co-Doped Ga2O3: Si—In Grown by MOCVD," *Coatings* 2021, 11, 287; pp. 1-7. https://doi.org/10.3390/coatings11030287.

Junhee Lee et al., "Study of Phase Transition in MOCVD Grown Ga2O3 from K to B Phase by Ex Situ and In Situ Annealing," *Photonics* 2021, 8, 17; pp. 1-8. https://doi.org/10.3390/photonics8010017.

* cited by examiner

| | Material1 | Material2 |
|---|---|---|
| Type 1 | $Ga_2O_3$ | AlN/AlGaN |
| Type 2 | AlN/AlGaN | $Ga_2O_3$ |

Material2

Material 1

Sapphire (Substrate)

FIG. 3

III-NITRIDE/GALLIUM OXIDE BASED HIGH ELECTRON MOBILITY TRANSISTORS

CROSS-REFERENCE TO RELATED APPLICATIONS

The present application claims priority to U.S. provisional patent application No. 63/243,802 that was filed Sep. 14, 2021 and to U.S. provisional patent application No. 63/290,265 that was filed Dec. 16, 2021, the entire contents of both of which are incorporated herein by reference.

REFERENCE TO GOVERNMENT RIGHTS

This invention was made with government support under FA9550-19-1-0410 awarded by the Air Force Office of Scientific Research. The government has certain rights in the invention.

BACKGROUND

Growing attention has been given to materials to be utilized for future power devices such as high-power solid-state sources, radio frequency (RF) power transistors, high-power per element phased arrays, and power amplifiers. III-Nitride materials are generally utilized for the aforementioned power devices and III-Nitride based high electron mobility transistors (HEMTs) have demonstrated excellent power performance and high-frequency characteristics.

SUMMARY

Provided are high electron mobility transistors (HEMTs) comprising a III-Nitride semiconductor (e.g., AlGaN) that forms an interface with a gallium oxide (e.g., $\kappa$-Ga$_2$O$_3$) semiconductor. Compared with the theoretically calculated breakdown electric field of 3.14 MV/cm for gallium nitride (GaN), gallium oxide (Ga$_2$O$_3$) has a much higher value of 8 MV/cm. However, RF devices fabricated solely on Ga$_2$O$_3$ face limited performance in view of the low thermal conductivity of the material. Combining Ga$_2$O$_3$ with a III-Nitride semiconductor (e.g., AlN) is intriguing, but presents significant practical challenges that, until the present disclosure, have not been overcome due to the dissimilar nature of the two semiconductor materials. The Example of the present disclosure demonstrates how these challenges have been met to provide HEMTs that exhibit very high electron Hall mobilities, e.g., more than 360 cm$^2$V$^{-1}$ s$^{-1}$ (see Table 1).

High electron mobility transistors are provided. In embodiments, such a transistor comprises a III-Nitride semiconductor layer comprising a III-Nitride semiconductor, in contact with a gallium oxide semiconductor layer comprising gallium oxide, forming an interface therebetween. Devices comprising the high electron mobility transistors are also provided. Methods of forming and using the high electron mobility transistors are also provided.

Other principal features and advantages of the disclosure will become apparent to those skilled in the art upon review of the following drawings, the detailed description, and the appended claims.

BRIEF DESCRIPTION OF DRAWINGS

Illustrative embodiments of the disclosure will hereafter be described with reference to the accompanying drawings.

FIG. 3 shows a schematic of Type 1 and Type 2 HEMT heterostructures that were grown using MOCVD.

DETAILED DESCRIPTION

Provided are high electron mobility transistors (HEMTs). The HEMTs comprise a a III-Nitride semiconductor layer and a gallium oxide semiconductor layer which are in contact with one another, thereby forming an interface between the two layers. The term "III" refers to a group III element such as aluminum (Al), gallium (Ga), and indium (In). In embodiments, the group III element is Al, Ga, or a combination thereof. If a combination of different group III elements is used, e.g., Al and Ga, they may be present in any ratio. For example, in the III-Nitride semiconductor AlGaN (which may also be referred to as Al$_x$Ga$_{1-x}$N), x may range from 0.1 to 0.9, from 0.1 to 0.6, or from 0.2 to 0.5. The III-Nitride semiconductor layer may be in the form of a single layer of a single type of III-Nitride semiconductor, e.g., AlN. However, in embodiments, the III-Nitride semiconductor layer is in the form of multiple (e.g., 2, 3, 4, or more) sublayers of different types of III-Nitride semiconductors, e.g., a AlN sublayer and an AlGaN sublayer. As noted above, the Al and Ga may be present in any ratio in the AlGaN sublayer. The III-Nitride semiconductor layer (and any sublayers) may be undoped. In embodiments, the III-Nitride semiconductor layer consists of one or more types of III-Nitride semiconductors, i.e., no other elements or semiconductors are present. In embodiments, the III-Nitride semiconductor layer consists of two III-Nitride semiconductor sublayers.

The phrase "gallium oxide" refers to a compound of Ga$_2$O$_3$. The gallium oxide semiconductor layer may be in the form of a single layer of Ga$_2$O$_3$. The gallium oxide semiconductor layer may be doped, e.g., with a group IV element ("IV") such as silicon (Si). In embodiments, the gallium oxide semiconductor layer consists of Ga$_2$O$_3$ and a dopant, e.g., Si. The gallium oxide semiconductor layer may be characterized by its phase, which may be e.g., $\beta$ or $\kappa$. The phase type may be determined using XRD as described in the Example below.

Figure 5A:
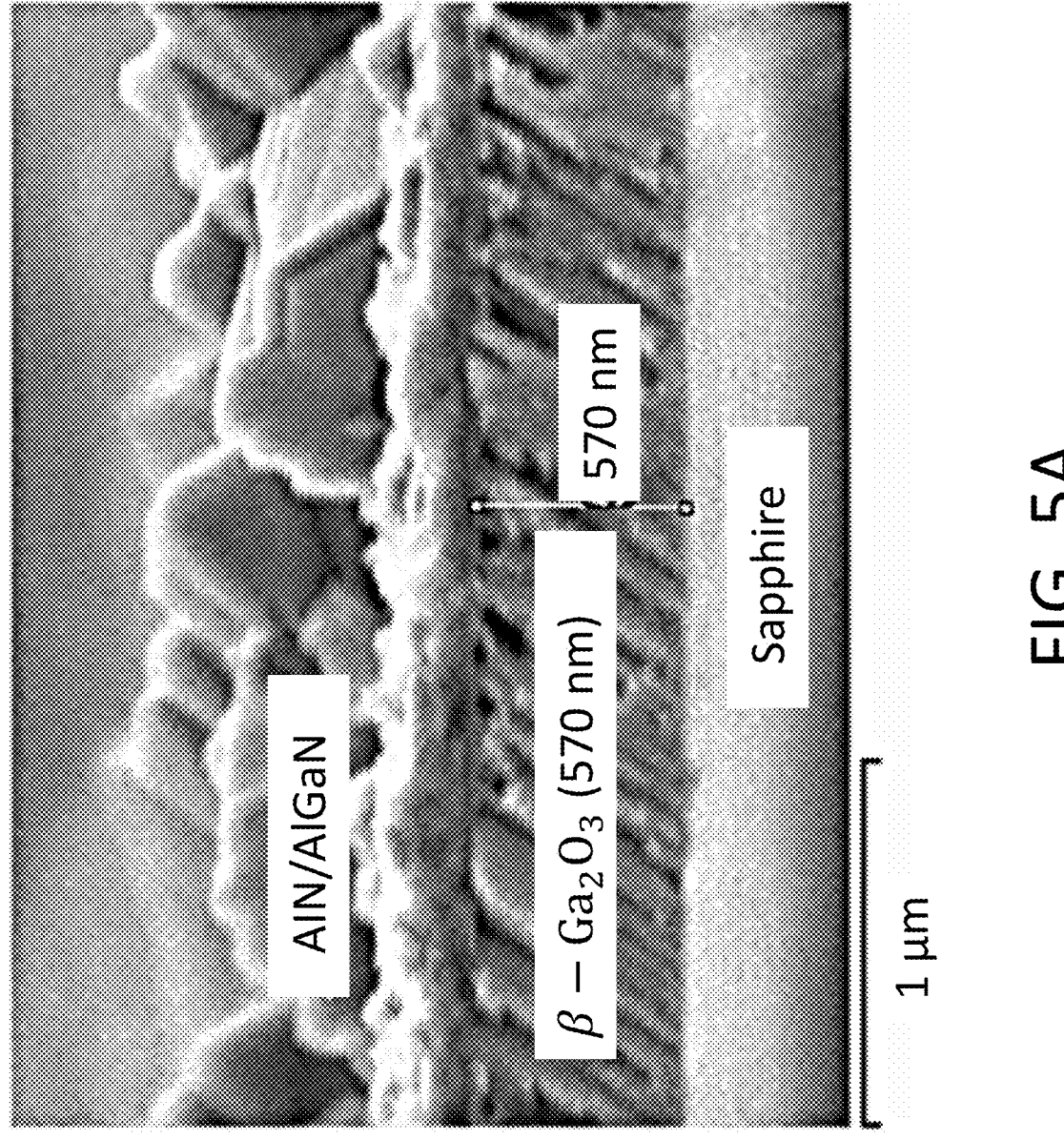
FIG. 5A-5C show the cross-sectional SEM images for the heterostructures of FIGS. 4A-4C, including Type 1 (FIG. 5A), Type 2 prior to annealing (FIG. 5B), and Type 2 after annealing (FIG. 5C).
Figure 5B:
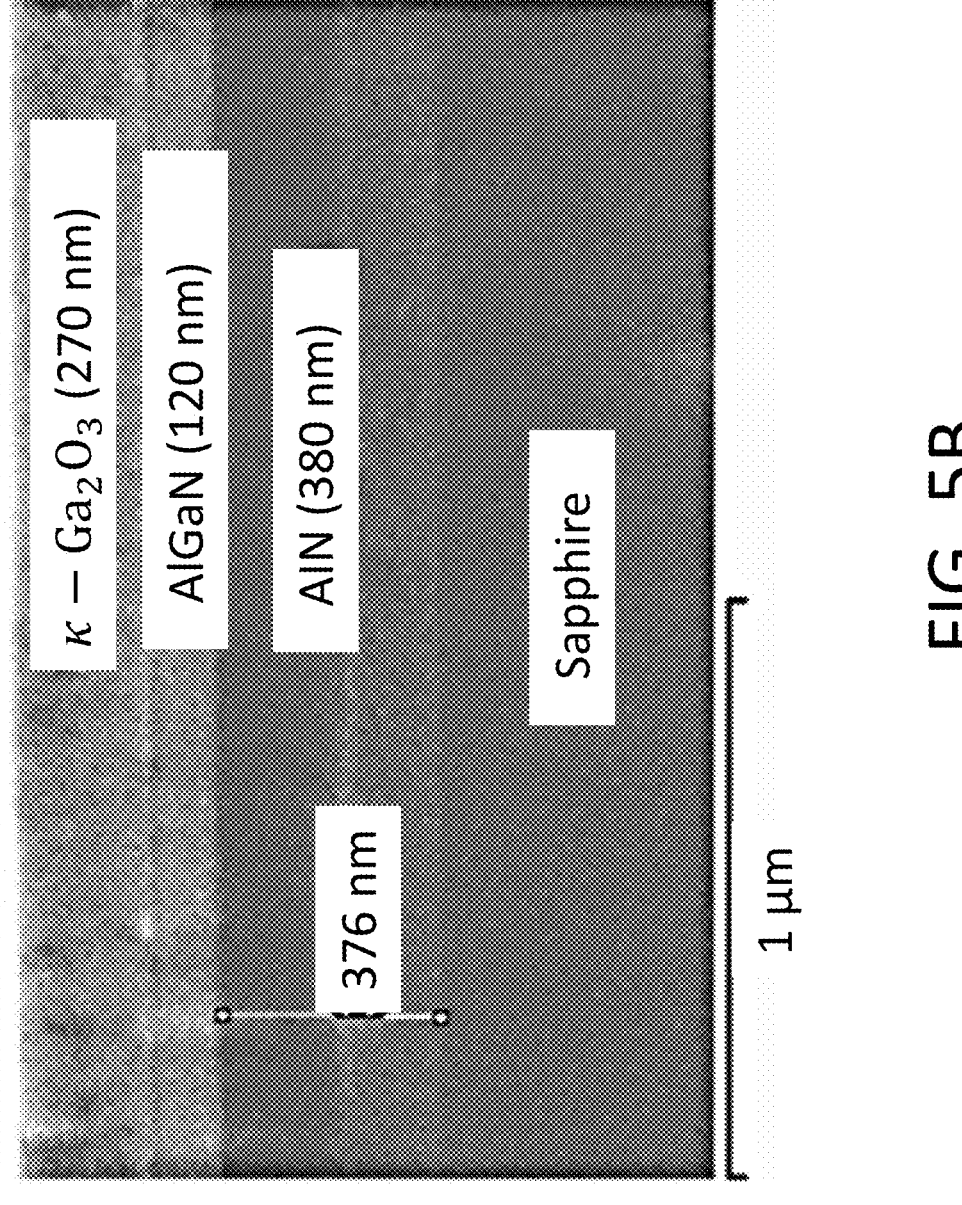
Figure 5C:
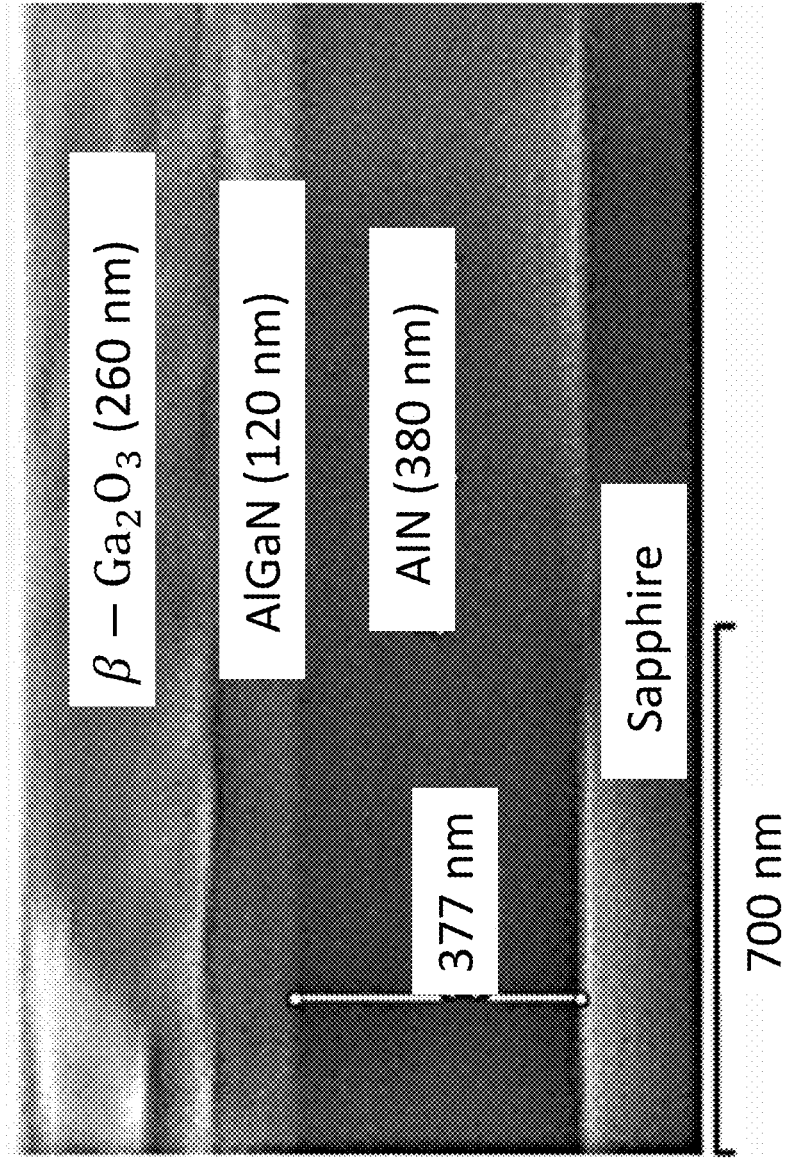

The III-Nitride semiconductor layer and the gallium oxide semiconductor layer may be disposed over a substrate. A variety of substrates may be used, e.g., sapphire (a-sapphire, m-sapphire, c-sapphire), silicon (Si(111), Si(100)), GaN, SiC. The ordering of the III-Nitride semiconductor layer and the gallium oxide semiconductor layer relative to an underlying substrate may vary. In embodiments, the III-Nitride semiconductor layer is between an overlying gallium oxide semiconductor layer and an underlying substrate. In such embodiments, the III-Nitride semiconductor layer is in direct contact with the gallium oxide semiconductor layer so as to form the interface; the III-Nitride semiconductor layer may be in direct contact with the substrate. (See FIGS. 5B and 5C.) In embodiments, the gallium oxide layer is between an overlying III-Nitride semiconductor layer and an underlying substrate. In such embodiments, the gallium oxide semiconductor layer is in direct contact with the III-Nitride semiconductor layer so as to form the interface; the gallium oxide semiconductor layer may be in direct contact with the substrate (See FIG. 5A.) In any of the embodiments in this paragraph (as well as the present disclosure), sublayers of the III-Nitride semiconductor layer may assume any order relative to the underlying substrate. However, in embodiments, an ordering as shown in FIGS. 5B and 5C is used.

In embodiments, the III-Nitride semiconductor layer consists of AlN. In embodiments, the III-Nitride semiconductor layer consists of a sublayer of AlN and a sublayer of AlGaN. In embodiments, the gallium oxide semiconductor layer consists of Si-doped β-$Ga_2O_3$ or Si-doped κ-$Ga_2O_3$. In embodiments, the HEMT is free of any other semiconductor other than the one or more types of the III-Nitride semiconductors and the gallium oxide semiconductor (which may be doped).

The III-Nitride semiconductor layer (including any sublayers, if present) and the gallium oxide layer may each be characterized by their morphology, e.g., as determined using SEM as described in the Example, below. In embodiments, these layers may be described as being in the form of a continuous film (see the layers in FIGS. 5B and 5C) as opposed to being in the form of a discontinuous film (see the III-Nitride semiconductor layer in FIG. 5A which is in the form of a discontinuous film composed of discrete islands).

The III-Nitride semiconductor layer and the gallium oxide layer may each be characterized by their thickness, e.g., as determined from SEM cross-sectional images as described in the Example, below. As shown in FIGS. 5A-5C, the thickness of an individual layer (or sublayer) is measured in a direction perpendicular to the plane defined by the layer. For example, as shown in FIG. 5B, the thickness of the AlN sublayer is measured in a direction perpendicular to the AlN plane, from the interface formed with the overlying AlGaN sublayer to the interface formed with the underlying sapphire substrate. The thickness may be an average value determined from a number of locations across the layer.

The thickness of the III-Nitride semiconductor layer may be, e.g., in a range of from 300 nm to 1000 nm, from 400 nm to 900 nm, from 500 nm to 800 nm, or from 500 nm to 700 nm. These values may refer to a total thickness of the III-Nitride semiconductor layer if sublayers are present. Sublayer thicknesses may each vary, e.g., in a range of from 50 nm to 600 nm, from 100 nm to 500 nm, or from 200 nm to 400 nm. The thickness of the gallium oxide semiconductor layer may be within any of the ranges describe for the III-Nitride semiconductor layer and its sublayers (if present).

The III-Nitride semiconductor layer and the gallium oxide layer may each be characterized by their crystallinity, e.g., as determined from XRD spectra as described in the Example, below. In embodiments, these layers are of high crystalline quality as evidenced by sharp and narrow XRD peaks. In embodiments, the XRD peaks associated with the III-Nitride, the gallium oxide, or both, have a FWHM of no more than 2°, 1°, 0.5°, or 0.1°.

The interface formed between the III-Nitride semiconductor layer and the gallium oxide layer is capable of forming two-dimensional electron gas (2DEG) upon application of a voltage on an electrode operably connected to the interface. This may be confirmed using the electrical characterization techniques as described in the Example, below. (See also Table 1.)

The present HEMTs (and the 2DEG formed at the interface of the III-Nitride semiconductor layer and the gallium oxide layer) may be characterized by their electron Hall mobility at a particular temperature (e.g., room temperature or under liquid nitrogen). In embodiments, the room temperature Hall mobility may be at least 40 $cm^2$/Vs, at least at least 80 $cm^2$/Vs, at least 100 $cm^2$/Vs, or in a range of from 40 $cm^2$/Vs to 300 $cm^2$/Vs, from 40 $cm^2$/Vs to 200 $cm^2$/Vs, or from 40 $cm^2$/Vs to 150 $cm^2$/Vs. In embodiments, the liquid nitrogen temperature Hall mobility may be at least 300 $cm^2$/Vs, at least at least 400 $cm^2$/Vs, at least 500 $cm^2$/Vs, or in a range of from 300 $cm^2$/Vs to 800 $cm^2$/Vs, from 300 $cm^2$/Vs to 750 $cm^2$/Vs, or from 300 $cm^2$/Vs to 700 $cm^2$/Vs. Known techniques may be used to measure electron Hall mobility.

The present HEMTs (and the 2DEG formed at the interface of the III-Nitride semiconductor layer and the gallium oxide layer) may be characterized by their carrier concentrations at a particular temperature (e.g., room temperature or under liquid nitrogen). In embodiments, the room temperature carrier concentration is at least $10^{16}$ $cm^{-3}$, at least $10^{17}$ $cm^{-3}$, at least $10^{18}$ $cm^{-3}$ or in a range of from $10^{16}$ $cm^{-3}$ to $10^{18}$ $cm^{-3}$. In embodiments, the liquid nitrogen carrier concentration is at least $10^{16}$ $cm^{-3}$, at least $10^{17}$ $cm^{-3}$, at least $10^{18}$ $cm^{-3}$ or in a range of from $10^{16}$ $cm^{-3}$ to $10^{18}$ $cm^{-3}$.

The present HEMTs may include other components in addition to the III-Nitride semiconductor layer and the gallium oxide semiconductor layer, e.g., electrodes such as a source electrode, a gate electrode, and a drain electrode. These electrodes are operably connected to the semiconductor layers so as to induce the formation of the 2DEG at the interface. The HEMTs may be part of any type of electrical circuit, which in turn may be part of various types of devices such as cellular phones, satellite receivers, voltage converters, and radar equipment. The devices may be RF devices.

Methods of forming the present HEMTs are also encompassed by the present disclosure. The methods may be based on the technique of MOCVD and thus, may be carried out in any reactor system suitable for MOCVD. The methods comprise exposing a surface of a substrate positioned in a MOCVD reactor to various precursors under conditions which allow for the formation of the III-Nitride semiconductor layer and the gallium oxide layer described herein.

For the III-Nitride semiconductor layer, a III precursor and a nitrogen (N) precursor are used. The III precursor is metalorganic compound. A variety of III precursors may be used (and combinations thereof), depending upon the desired III-Nitride semiconductor. Illustrative Ga precursors include trimethylgallium, triethylgallium, triisopropylgallium, and triisobutylgallium. Illustrative Al precursors include trimethylaluminum, triethylaluminum, triisopropylaluminum, and triisobutylaluminum. The N precursor is a compound comprising nitrogen. Ammonia ($NH_3$) may be used as the N precursor.

For the gallium oxide semiconductor layer, a Ga precursor and an oxygen (O) precursor are used. Any of the Ga precursors described above may be used. The O precursor is a compound comprising oxygen. A variety of O precursors may be used, e.g., water, oxygen, $N_2O$, and ozone. A dopant precursor may also be used, e.g., a Si precursor (a compound comprising silicon). A variety of Si precursors may be used, e.g., $SiH_4$, tetraethylorthosilicate, $Si_2H_6$, and $SiCl_4$.

The precursors may be provided as a vapor which may further comprise a carrier gas. Various carrier gases may be used, e.g., $N_2$, Ar, $H_2$, and combinations thereof. The exposure of the substrate to any particular precursor(s) may be carried out by delivering the vapor comprising the precursor, and if used, the carrier gas, to the MOCVD reactor comprising the substrate. Conditions being used to achieve growth of the compound semiconductors include the substrate surface temperature and the pressure of the vapor (generated by the precursors and carrier gas(es)) over the substrate surface. These conditions may also be selected to achieve any of the III-Nitride semiconductor layers and the gallium oxide layers described herein. In embodiments, the substrate surface temperature is in the range of from 500° C. to 1500° C. This includes from 500° C. to 1000° C., from 500° C. to 800° C., and from 900° C. to 1200° C. In embodiments, the vapor pressure over the substrate surface is in the range of from 10 mbar to 150 mbar. This includes from 50 mbar to 100 mbar. In situ annealing may be used after growth of the III-Nitride semiconductor/gallium oxide layers.

Other MOCVD details and conditions may be used as described in U.S. Pat. No. 11,417,523 and International Patent Application PCT/US22/16056 (filed Feb. 11, 2022) may be used, each of which is incorporated by reference in its entirety.

Methods of using the present HEMTs are also encompassed by the present disclosure. The methods comprise applying a voltage to an electrode operably connected to the interface formed between the III-Nitride semiconductor layer and the gallium oxide semiconductor layer to induce a 2DEG to form at the interface.

EXAMPLE

Introduction

This Example demonstrates the existence of a 2DEG at an interface formed between III-Nitride and gallium oxide epilayers using both theoretical calculations and experimental results. According to the simulation model, spontaneous polarization as well as piezoelectric effect from N-polar III-Nitride materials supports the formation of a 2DEG, with a calculated 2DEG number density of $3.5 \times 10^{14}$ $cm^{-2}$ at the interface. Also, the simulation of N-polar III-nitride/gallium oxide-based transistors calculates a transconductance of between 500 to 1000 mS/mm. Experiments were conducted in which the III-Nitride and gallium oxide epilayers were grown on c-plane sapphire by metalorganic chemical vapor deposition (MOCVD). A substantial improvement in electrical properties by a factor of 3-40 was obtained for the III-Nitride/gallium oxide heterostructures as compared to reference materials. This is a substantial improvement over existing AlGaN/GaN HEMTs. The results show that radio-frequency (RF) power transistors based on the III-Nitride/gallium oxide heterostructures may achieve a factor of 10 increase in power density as compared to existing transistors, providing a solution to size, weight, and power (SWAP) constrained applications such as high-power solid-state sources, high-power per element phased arrays, and power amplifiers.

Experimental Details

The growth of $Ga_2O_3$ was performed on either previously grown AlN/AlGaN or c-plane sapphire substrates using an AIX200/4 MOCVD reactor at a growth temperature of 690° C. and a pressure of 50 mbar, using $H_2$ as a carrier gas. Trimethylgallium (TMGa) and pure $H_2O$ were used as Ga and O precursors, respectively, while $SiH_4$ was used as a precursor for the Si dopant. After material growth, post-growth thermal annealing was carried out under $N_2$ in situ within the MOCVD reactor. AlN and AlGaN epilayers were grown at a growth temperature of 1100° C. and 1000° C., respectively. Both $N_2/H_2$ was utilized as the carrier gas and TMGa, trimethylaluminum (TMAl), and ammonia ($NH_3$) were used as Ga, Al, and N precursors, respectively. Structural, optical, and electrical properties of the grown samples were fully analyzed before and after annealing. Field emission scanning electron microscopy (SEM) was used to investigate the surface morphology as well as to measure the thickness of the respective layers of nitride and oxide epitaxial layers. In addition, the structural integrity and the corresponding phase of the AlN, AlGaN, and $Ga_2O_3$ epitaxial layers were evaluated by high resolution X-ray diffraction (HR-XRD). Electrical characteristics, including resistivity, mobility, and carrier concentration, were obtained by using Van der Pauw Hall technique at room temperature. Optical characterizations were performed by photoluminescence measurement using an Ar ion laser with excitation wavelength of 244 nm.

Results and Discussion

Optimized device configurations were evaluated using 2D and 3D numerical modeling methods. For $Ga_2O_3$, the calculated breakdown electric field (6-8 MV/cm) is higher than that of GaN or SiC (~3 MV/cm), which when combined with electron mobility (~250-350 $cm^2/Vs$) and electron velocity ($1.2 \times 10^7$ cm/s) yields amongst the best figures of merit for power electronic and high frequency devices.

N-polar (nitrogen-polar) AlN/$\beta$-$Ga_2O_3$ HEMTs offer Spontaneous Polarization (SP)-dominant 2DEG charge densities, which are independent of the barrier thickness. This contrasts with GaN/AlGaN HEMTs, where with increasing barrier thickness, the 2DEG charge densities decrease with more barrier relaxing. Due to SP-dominant charges in the proposed AlN/$Ga_2O_3$ system, higher electron densities (~$10^{14}$ $cm^{-2}$) are possible in the N-polar AlN/$\beta$-$Ga_2O_3$HEMTs with higher barrier thickness. Saturation velocities on the order of 1 to $2 \times 10^5$ m/s are calculated, therefore with increased charge densities, ten times higher current may be achieved for these HEMTs.

To obtain the 2DEG channel, a large positive charge is required in the barrier region, which leads in the necessary electric field in the direction of the growth of the epilayer. This causes a downward bending of the energy bands. This field, along with the conduction band edge difference ($\Delta E_c$) between the barrier (N-polar AlN) and the buffer ($\beta$-$Ga_2O_3$) semiconductor, produce sufficient bending to support the formation of a 2DEG at the interface between these semiconductors. The N-polar AlN and $\beta$-$Ga_2O_3$ interface features a $\Delta E_c$ of 1.75 eV with an energy bandgap for AlN and $\beta$-$Ga_2O_3$ of 6.1 eV and 4.9 eV, respectively. This combination is optimum for creating a large electron sheet carrier density at the interface.

Figures 1A, 1B:
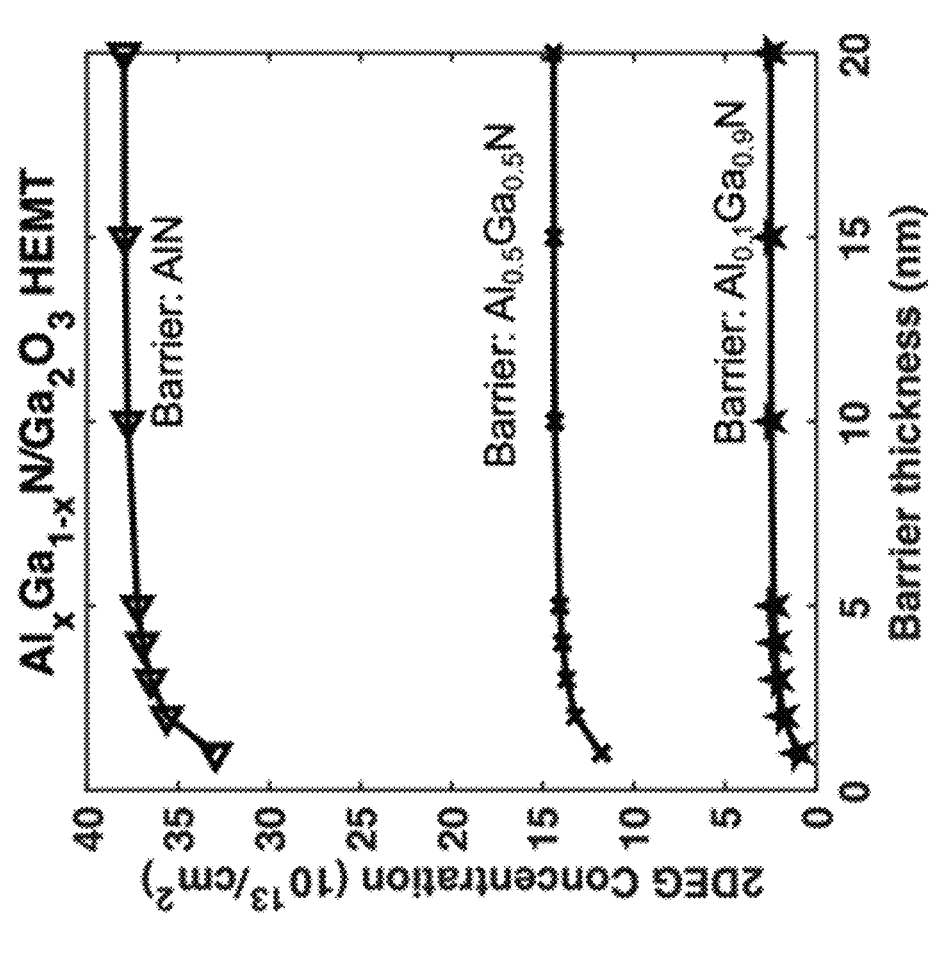
FIG. 1A shows an energy band diagram of an AlN/$\beta$-Ga$_2$O$_3$ HEMT.
FIG. 1B show a plot of carrier density in the two-dimensional electron gas (2DEG) formed at the AlN/$\beta$-Ga$_2$O$_3$ interface as a function of barrier thickness and Al/Ga ratio.

FIGS. 1A and 1B show the modeling results of the AlN/$\beta$-$Ga_2O_3$ heterostructure. When compared to AlGaN/GaN HEMT, the N-polar AlN/$\beta$-$Ga_2O_3$ heterojunction offers distinctive advantages. One advantage derives from the smaller piezoelectric effect in $Ga_2O_3$ as compared to GaN. Since GaN and AlGaN have similar piezoelectric effects, the net charge developed at the interface of an GaN/AlGaN HEMT from piezoelectric effect is insignificant. The largest amount of charge in such HEMTs originates from spontaneous charges. However, for AlN/$\beta$-$Ga_2O_3$, the already significant spontaneous charges (~1.333 $C/m^2$) are further supplemented by the piezoelectric charges (0.119 $C/m^2$).

Therefore, the total charges in the barrier are stronger ($\sim$1.452 C/m$^2$). This increases the band bending and 2DEG electron density. The simulations show that N-polar AlN barriers can provide a high 2DEG number density of 3.5$\times$ 10$^{14}$ cm$^{-2}$, translating to significantly improved performance in various high power or high frequency applications.

Figure 2A:
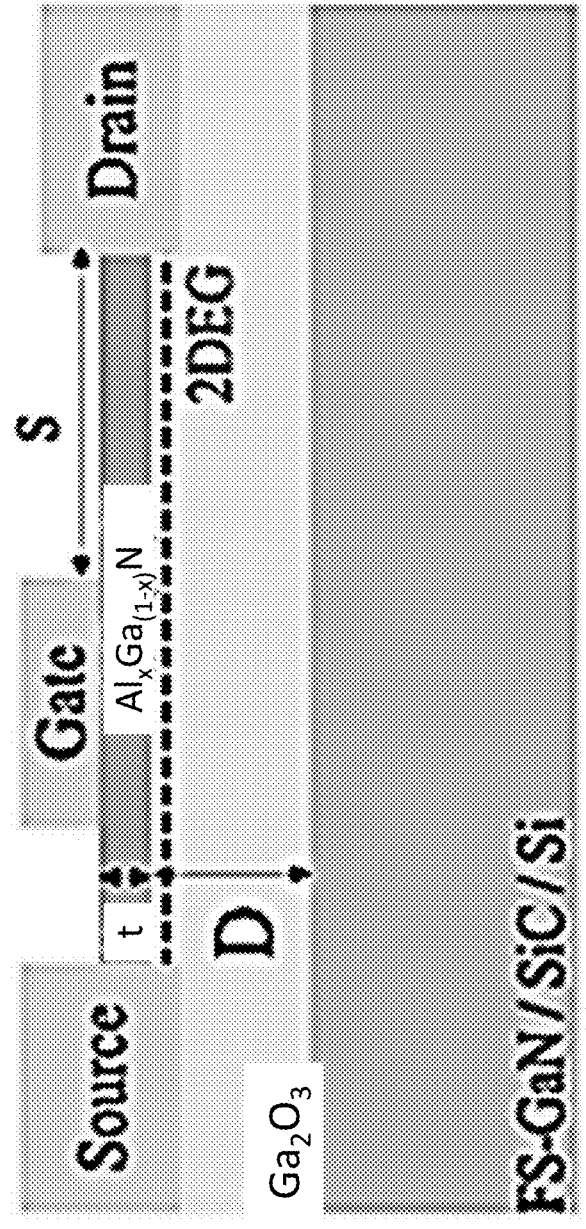
FIG. 2A shows a cross-sectional view of a III-Nitride/gallium oxide HEMT.
Figures 2B, 2C:
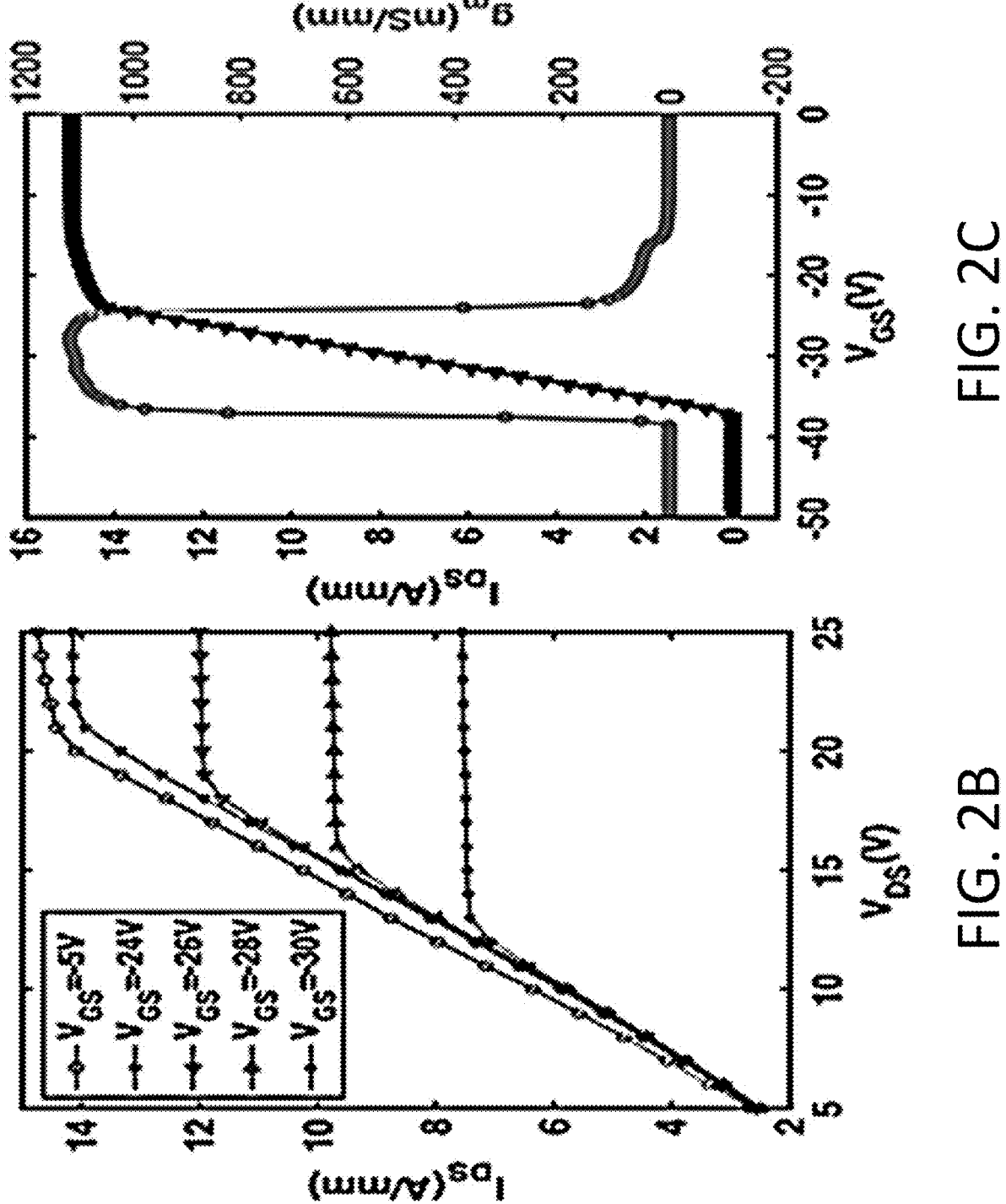
FIGS. 2B and 2C show the I-V and transfer characteristics for the HEMT.

DC characteristics of an illustrative N-polar AlN/$\beta$-Ga$_2$O$_3$ HEMT (FIG. 2A) as provided using the simulations are shown in FIGS. 2B and 2C. The high 2DEG electron density results in a high drain to source current. A large variation in the ON/OFF current is also shown in the transfer characteristic curve. The ON/OFF current slope provides a transconductance g$_m$ of between 500 to 1000 mS/mm. These high-performance characteristics, arising from high 2DEG density and good confinement, support the use of the HEMT in high-frequency applications.

Figure 3:
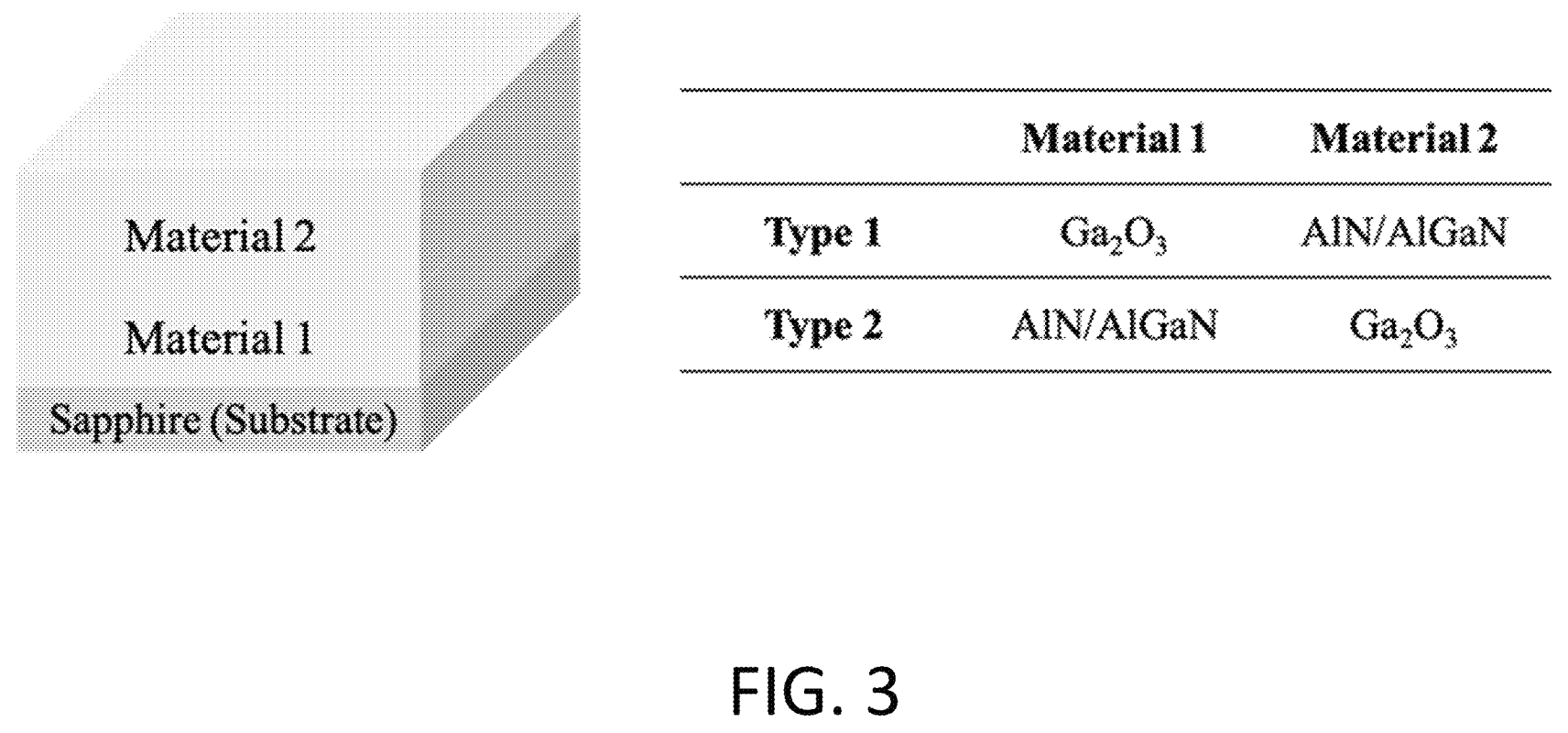
Figure 4A:
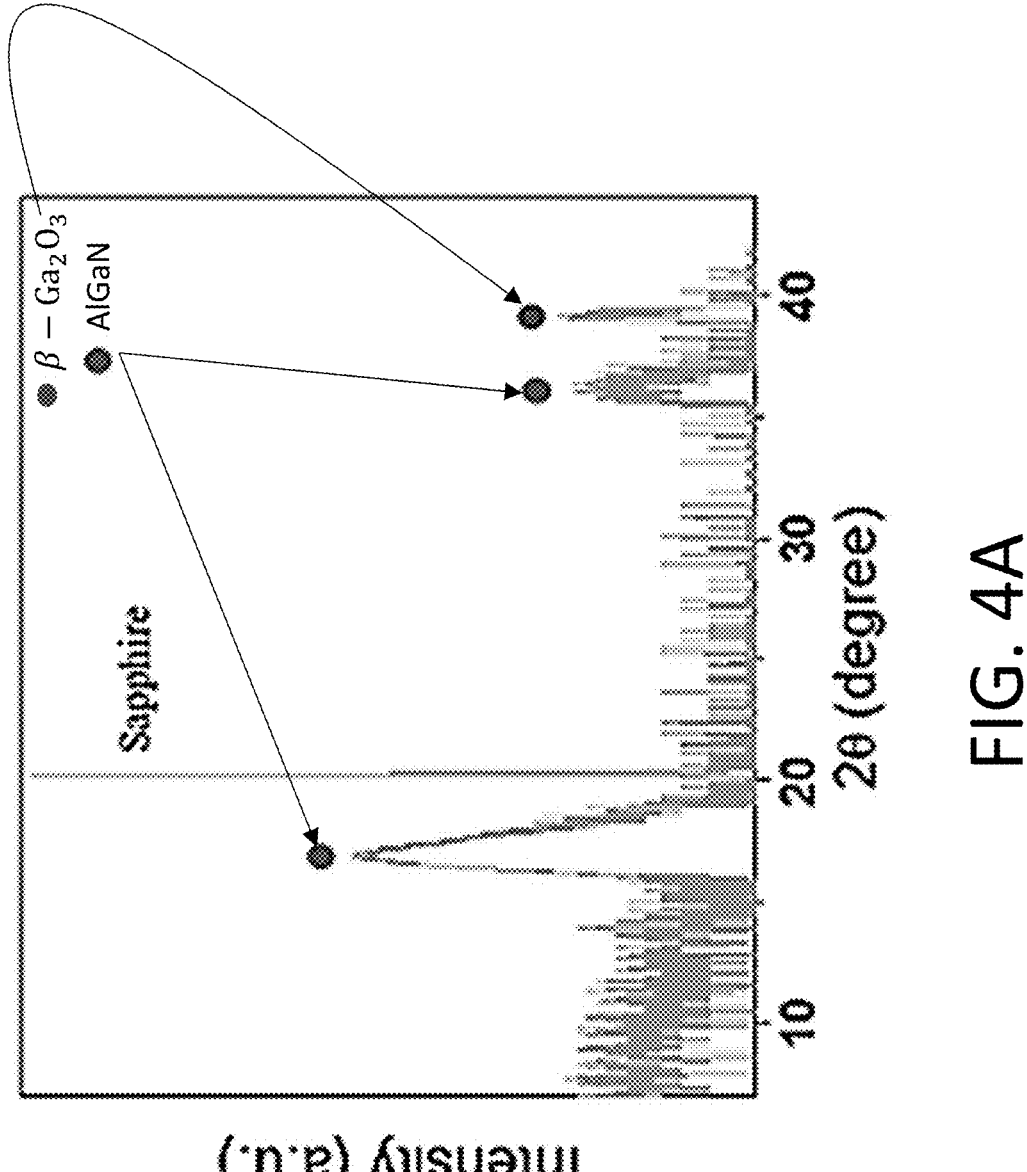
FIG. 4A shows the XRD spectrum for a Type 1 HEMT heterostructure.
Figure 4B:
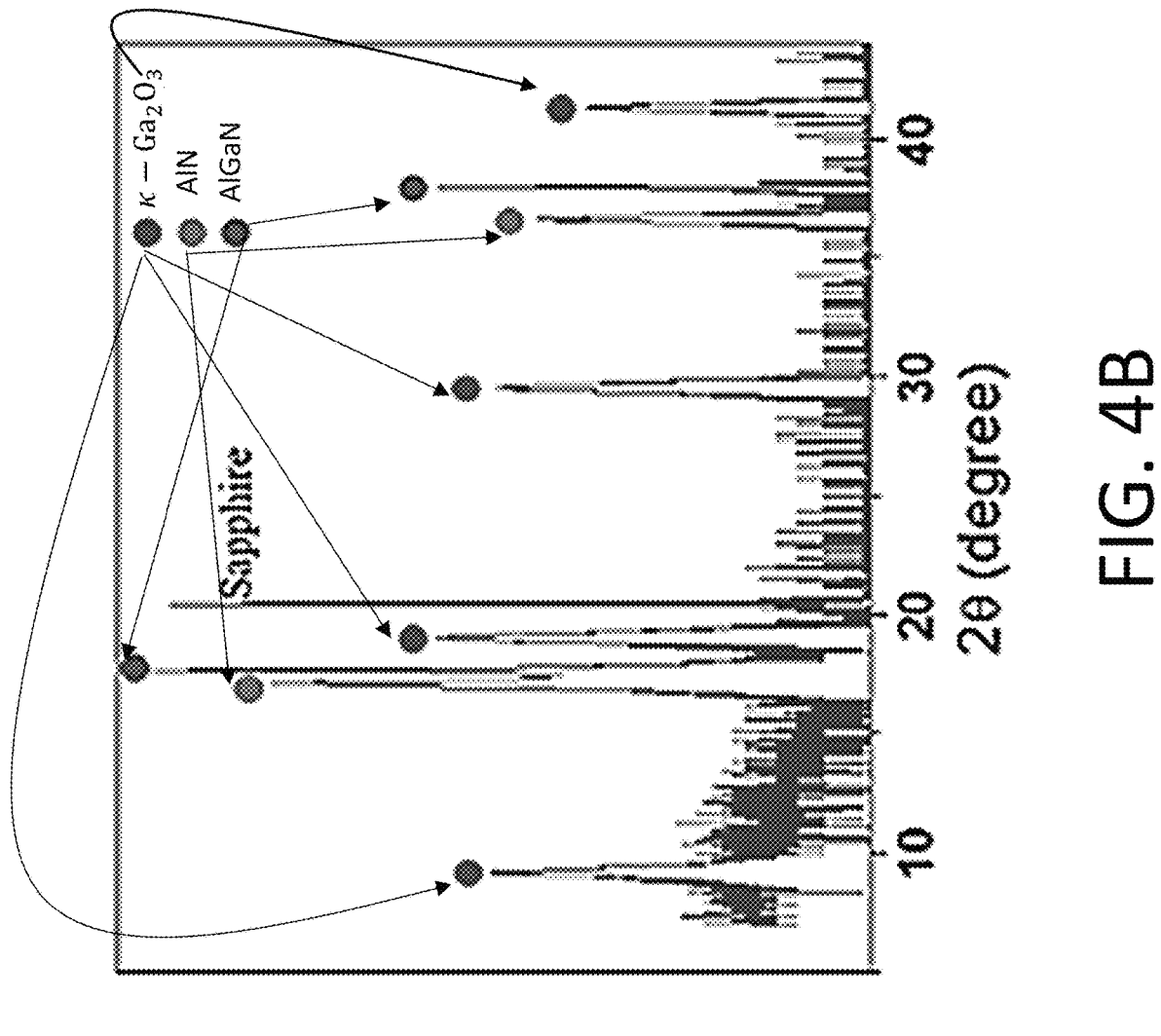
FIG. 4B shows the XRD spectrum for a Type 2 HEMT heterostructure prior to annealing ($\kappa$-Ga$_2$O$_3$).
Figure 4C:
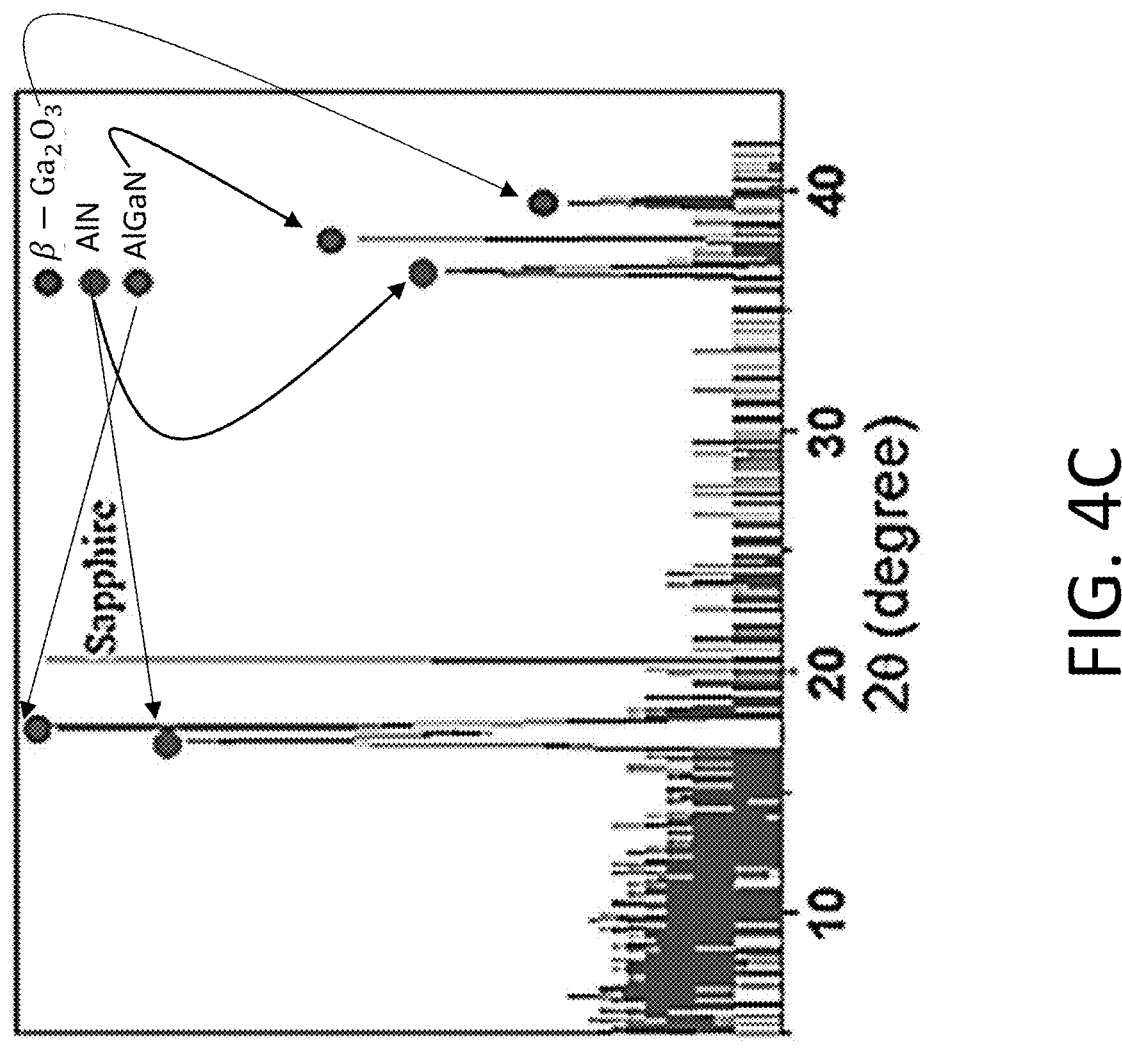
FIG. 4C shows the XRD spectrum for a Type 2 HEMT heterostructure after annealing ($\beta$-Ga$_2$O$_3$).

In addition to the theoretical calculations performed as described above, experiments were also conducted. FIG. 3 is a schematic of Type 1 and Type 2 heterostructures that were grown. For Type 1, a Ga$_2$O$_3$ epilayer was grown on sapphire substrate at 690° C. under H$_2$ as a carrier gas and AlN and AlGaN epilayers were subsequently grown at 1100° C. and 1000° C. (respectively). For Type 2, the opposite ordering was used, i.e., first AlN/AlGaN followed by Ga$_2$O$_3$. Prior to annealing the phase of the Ga$_2$O$_3$ was confirmed to be $\kappa$-phase; after annealing the phase of the Ga$_2$O$_3$ was confirmed to be $\beta$-phase. FIG. 4A shows the XRD pattern for the Type 1 heterostructure, showing broad and wide peaks (large full-width at half-maximum (FWHM)) for the nitride epilayers. By contrast, sharp and narrow peaks (small FWHM) peaks were obtained for both Type 2 structures, including $\kappa$-Ga$_2$O$_3$ (as-grown, not annealed) and $\beta$-Ga$_2$O$_3$ (annealed).

Further investigation of the structural properties of the Type 1 and 2 heterostructures was performed using SEM. The results showed that for Type 1 heterostructures, AlGaN was not in the form of a continuous film but rather islands, leading to the wide peaks in the XRD spectra. (See also the cross-sectional SEM image of FIG. 5A.) However, for Type 2 heterostructures, high quality Ga$_2$O$_3$ epilayers were successfully grown on AlN/AlGaN layers without defects. This is further evidenced from the cross-sectional SEM images shown in FIGS. 5B and 5C, showing the sharp interface between oxide and nitride films. Although high thermal annealing at 1000° C. was applied to change the phase of Ga$_2$O$_3$ from $\kappa$ to $\beta$, but no substantial differences in the structural properties were observed.

Table 1, below, shows the electrical performance for the Type 1 and 2 heterostructures. For reference, the electrical characteristics of as-grown Ga$_2$O$_3$ ($\kappa$-Ga$_2$O$_3$) on a c-plane sapphire substrate (no nitride) were highly resistive prior to annealing but conductive after annealing with an electron Hall mobility of about 15 cm$^2$/Vs at room temperature. Moreover, n-type AlGaN on a c-plane sapphire substrate (no Ga$_2$O$_3$) exhibited an electron Hall mobility of about 4 cm$^2$/Vs at room temperature. As shown in Table 1, using both semiconductors in the Type 1 and 2 heterostructures increases the electron Hall mobility a factor of about 3 to 40. Electron Hall mobilities at low temperature (under liquid nitrogen) are particularly high. For instance, the electron Hall mobility of the Type 1 heterostructure at room temperature was around 9 cm$^2$/Vs. However, when the heterostructure was exposed to the low temperature, the electron Hall mobility increased to 691 cm$^2$/Vs. The Type 2 heterostructures both showed significantly improved electron Hall mobility at room temperature and at low temperature (as compared to the Ga$_2$O$_3$ and AlGaN reference structures).

TABLE 1

| Electron Hall Mobilities for Type 1 and 2 Heterostructures. | | | |
| --- | --- | --- | --- |
| Heterostructure | Temperature | Carrier Concentration (cm$^{-3}$) | Electron Hall Mobility (cm$^2$/Vs) |
| Type 1 | Room | $-3.9 \times 10^{18}$ | 9 |
| Type 1 | Under LN$_2$ | $-3.5 \times 10^{17}$ | 691 |
| Type 2 (pre-annealing, $\kappa$-Ga$_2$O$_3$) | Room | $1.02 \times 10^{18}$ | 124.8 |
| Type 2 (pre-annealing, $\kappa$-Ga$_2$O$_3$) | Under LN$_2$ | $4.0 \times 10^{17}$ | 363 |
| Type 2 (post annealing, $\beta$-Ga$_2$O$_3$) | Room | $5.35 \times 10^{17}$ | 42.7 |
| Type 2 (post annealing, $\beta$-Ga$_2$O$_3$) | Under LN$_2$ | — | |

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

If not already included, all numeric values of parameters in the present disclosure are proceeded by the term "about" which means approximately. This encompasses those variations inherent to the measurement of the relevant parameter as understood by those of ordinary skill in the art. This also encompasses the exact value of the disclosed numeric value and values that round to the disclosed numeric value.

The foregoing description of illustrative embodiments of the invention has been presented for purposes of illustration and of description. It is not intended to be exhaustive or to limit the disclosure to the precise form disclosed, and modifications and variations are possible in light of the above teachings or may be acquired from practice of the disclosure. The embodiments were chosen and described in order to explain the principles of the disclosure and as practical applications of the disclosure to enable one skilled in the art to utilize the disclosure in various embodiments and with various modifications as suited to the particular use contemplated. It is intended that the scope of the disclosure be defined by the claims appended hereto and their equivalents.

What is claimed is:

1. A high electron mobility transistor comprising a III-Nitride semiconductor layer comprising a III-Nitride semiconductor, in contact with a gallium oxide semiconductor layer comprising gallium oxide, forming an interface therebetween, wherein the high electron mobility transistor further comprises an electrode operably connected to the interface and the high electron mobility transistor is configured to induce formation of a two-dimensional electron gas (2DEG) at the interface between the III-Nitride semiconductor layer and the gallium oxide semiconductor layer upon application of a voltage to the electrode, wherein the III-Nitride semiconductor layer comprises a first sublayer comprising AlN and a second sublayer comprising AlGaN.

2. The high electron mobility transistor of claim 1, wherein the III-Nitride semiconductor layer comprises AlGaN, AlN, or both.

3. The high electron mobility transistor of claim 1, wherein the III-Nitride semiconductor layer consists of the first and second sublayers.

4. The high electron mobility transistor of claim 1, further comprising a substrate, wherein the gallium oxide semiconductor layer is between the III-Nitride semiconductor layer and the substrate.

5. The high electron mobility transistor of claim 1, wherein the transistor is free of any other semiconductor other than one or more types of the III-Nitride semiconductor and the gallium oxide.

6. A method of forming the high electron mobility transistor of claim 1, the method comprising exposing a substrate positioned in a metalorganic chemical vapor deposition reactor to a III precursor and a nitrogen precursor under conditions to grow the III-Nitride semiconductor of the III-Nitride semiconductor layer; and exposing the substrate to a Ga precursor, an oxygen precursor, and a IV precursor under conditions to grow the gallium oxide of the gallium oxide semiconductor layer.

7. A method of using the high electron mobility transistor of claim 1, the method comprising applying the voltage to the electrode.

8. A high electron mobility transistor comprising a III-Nitride semiconductor layer comprising a III-Nitride semiconductor, in contact with a gallium oxide semiconductor layer comprising gallium oxide, forming an interface therebetween, wherein the high electron mobility transistor further comprises an electrode operably connected to the interface and the high electron mobility transistor is configured to induce formation of a two-dimensional electron gas (2DEG) at the interface between the III-Nitride semiconductor layer and the gallium oxide semiconductor layer upon application of a voltage to the electrode, wherein the gallium oxide is $\kappa$-$Ga_2O_3$.

9. A high electron mobility transistor comprising a III-Nitride semiconductor layer comprising a III-Nitride semiconductor, in contact with a gallium oxide semiconductor layer comprising gallium oxide, forming an interface therebetween, wherein the high electron mobility transistor further comprises an electrode operably connected to the interface and the high electron mobility transistor is configured to induce formation of a two-dimensional electron gas (2DEG) at the interface between the III-Nitride semiconductor layer and the gallium oxide semiconductor layer upon application of a voltage to the electrode, wherein the gallium oxide semiconductor layer is doped with a group IV element.

10. The high electron mobility transistor of claim 9, wherein the group IV element is Si.

11. A high electron mobility transistor comprising a III-Nitride semiconductor layer comprising a III-Nitride semiconductor, in contact with a gallium oxide semiconductor layer comprising gallium oxide, forming an interface therebetween, wherein the high electron mobility transistor further comprises an electrode operably connected to the interface and the high electron mobility transistor is configured to induce formation of a two-dimensional electron gas (2DEG) at the interface between the III-Nitride semiconductor layer and the gallium oxide semiconductor layer upon application of a voltage to the electrode, wherein the gallium oxide semiconductor layer consists of Si-doped $Ga_2O_3$.

12. A high electron mobility transistor comprising a III-Nitride semiconductor layer comprising a III-Nitride semiconductor, in contact with a gallium oxide semiconductor layer comprising gallium oxide, forming an interface therebetween, wherein the high electron mobility transistor further comprises an electrode operably connected to the interface and the high electron mobility transistor is configured to induce formation of a two-dimensional electron gas (2DEG) at the interface between the III-Nitride semiconductor layer and the gallium oxide semiconductor layer upon application of a voltage to the electrode, further comprising a substrate, wherein the III-Nitride semiconductor layer is between the gallium oxide semiconductor layer and the substrate.

13. The high electron mobility transistor of claim 12, wherein the III-Nitride semiconductor layer comprises a first sublayer of AlN and a second sublayer of AlGaN and the second sublayer of AlGaN forms the interface with the gallium oxide semiconductor layer.

14. The high electron mobility transistor of claim 13, wherein the gallium oxide semiconductor layer is doped with Si and the gallium oxide is $\kappa$-$Ga_2O_3$.

15. The high electron mobility transistor of claim 14, wherein the III-Nitride semiconductor layer consists of the first and second sublayers and the gallium oxide semiconductor layer consists of Si-doped $Ga_2O_3$.

16. The high electron mobility transistor of claim 15, wherein the transistor is free of any other semiconductor other than AlN, AlGaN, and $Ga_2O_3$.

17. The high electron mobility transistor of claim 13, wherein X-ray diffraction peaks associated with the second sublayer of AlGaN of the III-Nitride semiconductor layer and X-ray diffraction peaks associated with the gallium oxide are each characterized by a full-width at half maximum of no more than 1°.

18. The high electron mobility transistor of claim 12, wherein the III-Nitride semiconductor layer has a thickness in a range of from 450 nm to 650 nm.

* * * * *